United States Patent [19]
Caviasca et al.

[11] Patent Number: 5,282,152
[45] Date of Patent: Jan. 25, 1994

[54] INTEGER-BASED 18-BIT RGB TO 5-BIT GRAY SCALE CONVERSION DEVICE AND METHOD THEREFOR

[75] Inventors: Kenneth P. Caviasca, Phoenix; Phillip E. Mattison, Gilbert, both of Ariz.

[73] Assignee: VLSI Technology, Inc., San Jose, Calif.

[21] Appl. No.: 860,931

[22] Filed: Mar. 31, 1992

[51] Int. Cl.$^5$ .............................................. G06F 7/38
[52] U.S. Cl. ................................................ 364/715.01
[58] Field of Search ...................... 364/715.01, 715.03, 364/715.07, 715.08; 395/131, 132; 341/98; 358/50

[56] References Cited

U.S. PATENT DOCUMENTS

| | | | |
|---|---|---|---|
| 4,023,200 | 5/1977 | Hess | 358/50 |
| 4,573,135 | 2/1986 | Dieterich | 364/724.01 |
| 4,839,839 | 6/1989 | Tokumaru et al. | 364/715.08 |

Primary Examiner—Long T. Nguyen
Attorney, Agent, or Firm—Harry M. Weiss

[57] ABSTRACT

A device and method for converting 18-bit RGB data to 5-bit gray scale data is disclosed. This device and method comprises a barrel shifter, an adder, a palette storage register, and control logic. The red data is loaded first into the barrel shifter, and is shifted, added and stored in the palette storage register. The green data is then loaded into the barrel shifter and is shifted and added to the value stored in the palette storage register. The blue data is then loaded into the barrel shifter and is shifted and added to the value stored in the palette storage register, thereby completing the conversion. The five most significant bits of the six-bit palette storage register are output as gray scale data. The shifting and adding of these six-bit integers allow a binary approximation of the appropriate coefficients for each block of color data.

9 Claims, 1 Drawing Sheet

INTEGER-BASED 18-BIT RGB TO 5-BIT GRAY SCALE CONVERSION DEVICE AND METHOD THEREFOR

FIELD OF THE INVENTION

This invention generally relates to computer display devices and methods, and, more specifically, relates to a device and method which converts 18-bit display data in Red-Green-Blue (RGB) format to a 5-bit gray scale format and method therefor, accordingly, this device and method is used to adapt RGB display data to a format suitable to a monochrome display device, such as an LCD display.

DESCRIPTION OF THE PRIOR ART

The prior art RGB to gray scale conversion device and method required many shifters, dividers, adders, and storage elements to perform the desired conversion. The delay generated by the several successive stages of logic limited the operating bandwidth of the conversion device. In addition, the complexity of these systems required a high gate count, resulting in high cost, high power consumption, greater circuit size, and decreased reliability.

Therefore, there existed a need to provide an RGB to gray scale conversion device and method that has a higher operating bandwidth than the devices of the prior art, and a simple implementation of fewer gates thereby reducing cost, complexity, power consumption, and circuit size while increasing reliability.

SUMMARY OF THE INVENTION

It is an object of this invention to provide an integer-based 18-bit RGB to 5-bit gray scale conversion device and method therefor.

It is another object of this invention to provide an integer-based RGB to 5-bit gray scale conversion device and method therefor comprising a barrel shifter, an adder, a palette storage register, and control logic.

According to the present invention, an integer-based 18-bit RGB to 5-bit gray scale conversion device and method are provided. This device comprises a barrel shifter, an adder, and a palette storage register. The barrel shifter has parallel outputs which provide one set of inputs on the adder. The adder output lines provide the input to the palette storage register. The outputs of the palette storage register feed back to the second set of inputs on the adder. The barrel shifter, adder, and storage register act in response to control logic.

The 18-bit integer word that represents display data in RGB format is loaded into the conversion device in three 6-bit blocks, corresponding to the red data, green data, and blue data. A conversion is commenced when the 6-bit block corresponding to the red data is loaded into the barrel shifter. This red data is shifted, passed through the adder, stored in the palette storage register, shifted again, and added to the newly stored data, the result of which is stored in the palette storage register. Similar operations are carried out with respect to the green data and the blue data until the conversion is complete. The converted 5-bit gray scale value in the palette storage register can now be used by the display system. In a typical application, the display system has a Random Access Memory (RAM) array containing the 18-bit RGB data and a similar RAM array that contains the converted, 5-bit gray scale data which is outputed to the monochrome display device.

The foregoing and other objects, features and advantages will be apparent from the following description of the preferred embodiment of the invention as illustrated in the accompanying drawings.

DESCRIPTION OF THE PREFERRED EMBODIMENT

Figure 1:
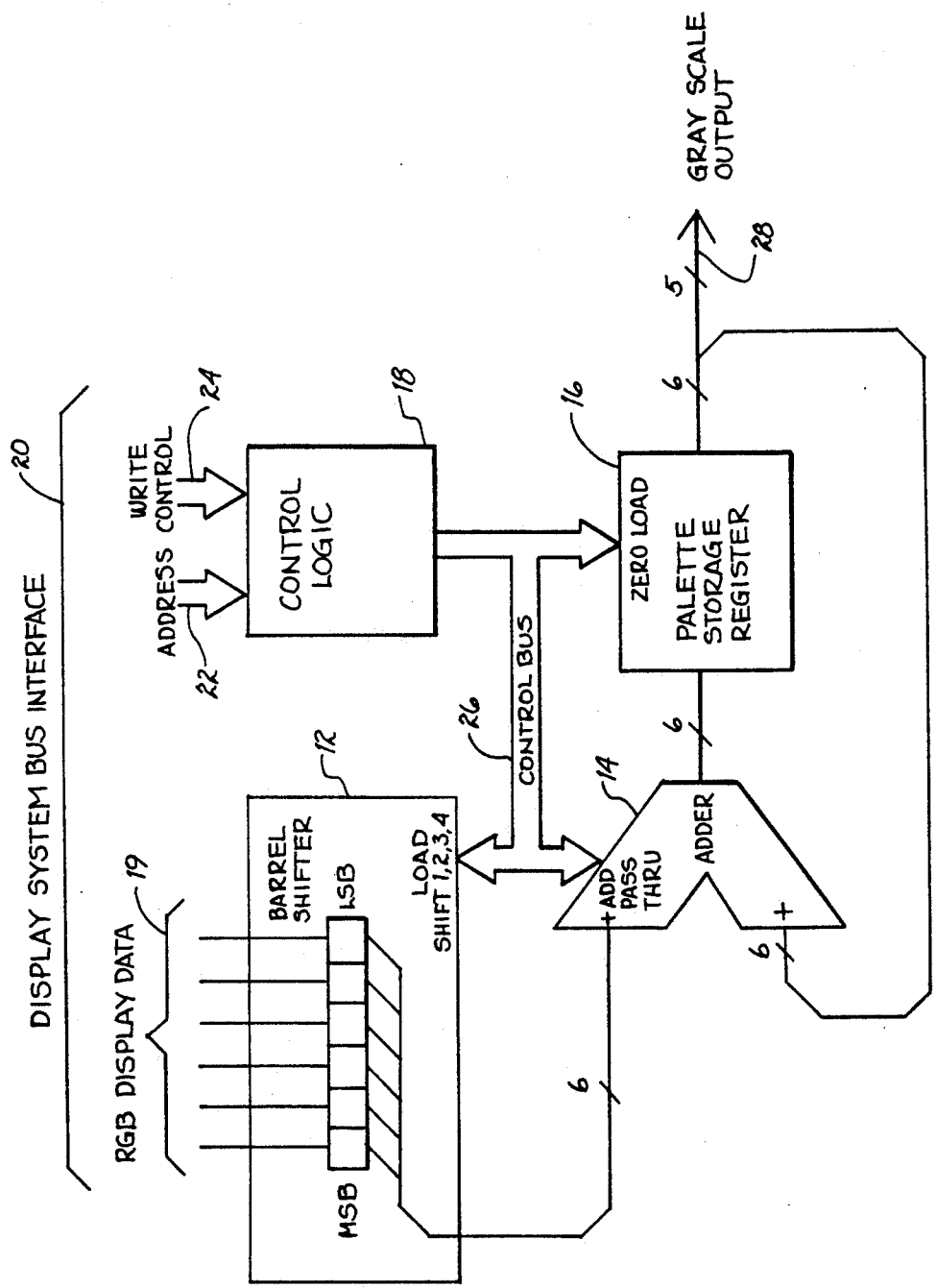
FIG. 1 is a block diagram of the 18-bit RGB to 5-bit gray scale conversion device of the present invention.

The conversion device of the present invention is shown in FIG. 1. The desired formula for implementing an RGB to gray scale conversion is:

$$Y = (0.30)R + (0.59)G + (0.11)B \quad (1)$$

where R is red data, G is green data, B is blue data, and Y is converted gray scale data. This formula is implemented in the conversion device and method of the present invention by the following operations:

$$Y = R(SR2) + R(SR4) + G(SR1) + G(SR3) + B(SR3) \quad (2)$$

where R, G, and B are the color data defined above, Y is converted gray scale data, and SR indicates that the color data is shifted to the right by the number of positions indicated by the number following the SR. Even though the result of this computation in the Palette Storage Register 16 is six bits long, only the five most significant bits are used for the Gray Scale Output 28, as shown in FIG. 1. However, all six bits of the Palette Storage Register 16 are fed back to the Adder 14.

Each shift right divides the 6-bit display data by two, so the resultant formula for this implementation is:

$$Y = (0.25)R + (0.0625)R + (0.5)G + (0.125)G + (0.125)B \quad (3)$$

$$= (0.3125)R + (0.625)G + (0.125)B \quad (4)$$

Comparing the coefficients in Equation (4) to the target values in Equation (2) shows that the integer method of shifting and adding provided by the conversion device of the present invention provides coefficients reasonably close to the target values. This manner of approximating the coefficients using shifting and adding techniques is the principal innovation of the conversion device of the present invention.

As shown in the figure, the device of the present invention comprises a Barrel Shifter 12, an Adder 14, a Palette Storage Register 16, and Control Logic 18. Barrel Shifter 12 has a 6-bit data input 19 through which a 6-bit block of the 18-bit RGB data is loaded. The Barrel Shifter 12 loads zeroes into the most significant bits as the shifting right occurs. Through the System Bus Interface 20, the display system writes 6-bit RGB data to the Barrel Shifter 12 and writes the appropriate control values to the ADDRESS 22 and WRITE CONTROL 24 inputs of Control Logic 18. The control values on the ADDRESS 22 and WRITE CONTROL 24 inputs are used by Control Logic 18 to determine how to appropriately drive the Control Bus 26 as shown. The Control Bus 26 provides the control signals for Barrel Shifter 12, Adder 14, and Palette Storage Register 16. The different functions for each of these devices is indicated where the Control Bus 26 connects to each device as shown in the figure. The Control Bus 26 can make the Barrel Shifter load, shift 1, shift 2, shift 3, or shift 4. The Control Bus 26 can make the Adder 14 either add or pass through the data on its inputs. The Control Bus 26 can make the Palette Storage Register 16 zero its bits or load data from the adder.

It is assumed that the display system will provide the appropriate control inputs on ADDRESS 22 and WRITE CONTROL 24 as needed and will provide the RGB display data as needed, and that Control Logic 18 will provide the proper control signals to Barrel Shifter 12, Adder 14, and Palette Storage Register 16 in the appropriate sequence. The operation of the conversion device and method of the present invention will be discussed without further reference to the external display system or the Control Logic 18.

The Display System initiates a conversion by writing the 6-bit block of RGB display data corresponding to red data into Barrel Shifter 12. This red data is then shifted right twice. This shifted red data is passed through the Adder 14 into Palette Storage Register 16. The shifted red data in Barrel Shifter 12 is then shifted twice more for a total of four shifts, and added to the stored data in the Palette Storage Register 16, with the result being loaded in the Palette Storage Register 16. At this point in time the Palette Storage Register 16 contains the result of the first two operations in Equation (2), namely R(SR2)+R(SR4).

The 6-bit block of green data is then loaded into Barrel Shifter 12. This green data is shifted right once and added to the data in the Palette Storage Register 16, with the result stored in Palette Storage Register 16. The green data is then shifted twice more for a total of three shifts, and added to the data in Palette Storage Register 16, with the result stored in Palette Storage Register 16. At this point in time the Palette Storage Register 16 contains the result of the first four operations in Equation (2), namely R(SR2)+R(SR4)+G(SR1)+G(SR3).

The 6-bit block of blue data is then loaded into Barrel Shifter 12. This blue data is shifted right three times and added to the data in the Palette Storage Register 16, with the result stored in Palette Storage Register 16. At this point the conversion is complete, and Palette Storage Register 16 contains the 6-bit result of all the addition operations in Equation (2), namely R(SR2)+R(SR4)+G(SR1)+G(SR3)+B(SR3). This 6-bit result is converted to 5-bit Gray Scale data by simply providing the 5 most significant bits of the 6-bit Palette Storage Register 16 to the Gray Scale Output 28. The display system can then access the data on the Gray Scale Output 28 and store it in RAM until it is outputed to the monochrome display device.

The simple design and operation of this conversion device and method has only three stages of logic, the Barrel Shifter 12, the Adder 14, and the Palette Storage Register 16. To implement the required conversion, five passes or iterations through the adder are required, as explained above. The RGB to gray scale conversion device of the prior art had significantly more stages, thereby increasing the total conversion time. Even with the iterations required by the conversion device and method of the present invention, the total conversion time is significantly less than the prior art devices and methods, which means that this conversion device can operate at a higher bandwidth than the devices and methods of the prior art. In addition, the low gate count and extremely simple design provide for decreased cost, complexity, power consumption, and circuit size, while increasing reliability when compared to conversion devices and methods of the prior art.

While the invention has been described in its preferred embodiment, it is to be understood that the words which have been used are words of description rather than limitation, and that changes may be made within the purview of the appended claims without departing from the true scope and spirit of the invention in its broader aspects.

I claim:

1. A device for converting 18-bit display data in Red-Green-Blue (RGB) format to a 5-bit gray scale format comprising, in combination:

a barrel shifter having a parallel input for receiving said 18-bit display data, a shift register, a parallel output, and control circuitry means for causing data on said parallel input to be loaded into said shift register when said control circuitry means is in a first state and for causing the data in said shift register to shift one of a plurality of positions to the right when said control circuitry means is in one of several other states, said parallel output being always actively driven to the binary state represented by the data in said shift register;

an adder having a first parallel input, a second parallel input, and a parallel output, said first parallel input of said adder electrically coupled to said parallel output of said barrel shifter, said adder having circuitry control means for causing the data on said first parallel input of said adder to pass through said adder directly to said parallel output of said adder when said circuitry control means is in a first state and for causing the data on said first parallel input to be binarily added to the data on said second parallel input with the result outputed on said parallel output of said adder when said circuitry control means is in a second state;

a palette storage register having a parallel input electronically coupled to said parallel output of said adder, a storage register, a parallel output electrically coupled to said second parallel input of said adder, and control circuit means for causing said data on said parallel input to be loaded into said storage register when said control circuit means is in a first state and for causing the data in said storage register to be cleared to a zero state when said control circuit means is in a second state, said parallel output of said palette storage register being always actively driven to the binary state represented by the data in said storage register;

control logic having an address input, a write control input, and control bus output means electrically coupled to said barrel shifter, to said adder, and to said palette storage register for driving said control circuitry means of said barrel shifter, said circuitry control means of said adder, and said control circuit means of said palette storage register to the appropriate state in the appropriate sequence in response to the inputs driven on said address input and said write control input; and gray scale output means having a plurality of electrical conductors electrically coupled to said parallel output means of said palette storage register for making the converted data in said palette storage register available to be at least one of stored and outputed to a monochrome display which is driven by gray scale data.

2. The device of claim 1 wherein said shift register having six inputs on said parallel input, having six outputs on said parallel output, and having six binary positions in said shift register electrically coupled to said parallel input and said parallel output.

3. The device of claim 1 wherein said adder having six inputs on each of said first parallel input and said second parallel input, and having six outputs on said parallel output.

4. The device of claim 1 wherein said palette storage register having six inputs on said parallel input, having six outputs on said parallel output, and having six binary positions in said storage register electrically coupled to said parallel input and said parallel output, said gray scale output means having five conductors electrically coupled to the five most significant bits of said six binary positions in said storage register.

5. A method for converting 18-bit display data in Red-Green-Blue (RGB) format to a 5-bit gray scale format comprising the steps of:

providing a barrel shifter having a parallel input for receiving said 18-bit display data, a shift register, a parallel output, and control circuitry means for causing the data on said parallel input to be loaded into said shift register when said control circuitry means is in a first state and for causing the data in said shift register to shift one of a plurality of positions to the right when said control circuitry means is in one of several other states, said parallel output being always actively driven to the binary state represented by the data in said shift register;

providing an adder having a first parallel input, a second parallel input, and a parallel output, said first parallel input electrically coupled to said parallel output of said barrel shifter, said adder having circuitry control means for causing the data on said first parallel input to pass through said adder directly to said parallel output of said adder when said circuitry control means is in a first state and for causing the data on said first parallel input to be binarily added to the data on said second parallel input with the result outputed on said parallel output means of said adder when said circuitry control means is in a second state;

providing a palette storage register having a parallel input electronically coupled to said parallel output of said adder, a storage register, a parallel output electrically coupled to said second parallel input of said adder, and control circuit means for causing said data on said parallel input to be loaded into said storage register when said control circuit means is in a first state and for causing the data in said storage register to be cleared to a zero state when said control circuit means is in a second state, said parallel output of said palette storage register being always actively driven to the binary state represented by the data in said storage register;

providing control logic having an address input, a write control input, and control bus output means electrically coupled to said barrel shifter, to said adder, and to said palette storage register for driving said control circuitry means of said barrel shifter, said circuitry control means of said adder, and said control circuit means of said palette storage register to the appropriate state in the appropriate sequence in response to the inputs driven on said address input and said write control input; and providing gray scale output means having a plurality of electrical conductors electrically coupled to said parallel output of said palette storage register for making the converted data in said palette storage register available to be at least one of stored and outputed to a monochrome display device which is driven by gray scale data.

6. The method of claim 5 wherein said shift register having six inputs on said parallel input, having six outputs on said parallel output, and having six binary positions in said shift register electrically coupled to said parallel input and said parallel output.

7. The method of claim 6 wherein said adder having six inputs on each of said first parallel input and said second parallel input, and having six outputs on said parallel output.

8. The method of claim 7 wherein said palette storage register having six inputs on said parallel input, having six outputs on said parallel output, and having six binary positions in said storage register electrically coupled to said parallel input and said parallel output, said gray scale output means having five conductors electrically coupled to the five most significant bits of said six binary positions in said storage register.

9. The method of claim 8 further comprising the steps of:

loading the six bits of said 18-bit display data in Red-Green-Blue (RGB) format corresponding to red data through said parallel input of said barrel shifter into said shift register of said barrel shifter;

shifting said six positions in said shift register of said barrel shifter two positions to the right, filling in zeroes in the most significant digits that are vacated due to said shifting, said shift register driving said parallel output of said barrel shifter, which drive said first parallel input of said adder with the binary value in said shift register;

passing said data from said first parallel input of said adder to said parallel output of said adder, which drives said parallel input of said palette register;

storing said data on said parallel input of said palette register into said six positions of said storage register of said palette register, which drive said parallel output of said palette register with the binary data in said storage register, said parallel output of said palette register driving said second parallel input of said adder;

shifting said six positions in said shift register of said barrel shifter two positions to the right, filling in zeroes in the most significant digits that are vacated due to said shifting, said shift register driving said parallel output of said barrel shifter, which drive said first parallel input of said adder with the binary value in said shift register;

binarily adding the values on said first parallel input and said second parallel input of said adder, with the result driven onto said parallel output of said adder, which in turn drive said parallel input of said palette register;

storing said data on said parallel input of said palette register into said six positions of said storage register of said palette register, which drive said parallel output of said palette register with the binary data in said storage register, said parallel output of said palette register driving said second parallel input of said adder;

loading the six bits of said 18-bit display data in Red-Green-Blue (RGB) format corresponding to green data through said parallel input of said barrel shifter into said shift register of said barrel shifter;

shifting said six positions in said shift register of said barrel shifter one position to the right, filling in zeroes in the most significant digit that is vacated due to said shifting, said shift register driving said parallel output of said barrel shifter, which drive said first parallel input of said adder with the binary value in said shift register;

binarily adding the values on said first parallel input and said second parallel input of said adder, with the result driven onto said parallel output of said adder, which in turn drive said parallel input of said palette register;

storing said data on said parallel input of said palette register into said six positions of said storage register of said palette register, which drive said parallel output of said palette register with the binary data in said storage register, said parallel output of said palette register driving said second parallel input of said adder;

shifting said six positions in said shift register of said barrel shifter two positions to the right, filling in zeroes in the most significant digits that are vacated due to said shifting, said shift register driving said parallel output of said barrel shifter, which drive said first parallel input of said adder with the binary value in said shift register;

binarily adding the values on said first parallel input and said second parallel input of said adder, with the result driven onto said parallel output of said adder, which in turn drive said parallel input of said palette register;

storing said data on said parallel input of said palette register into said six positions of said storage register of said palette register, which drive said parallel output of said palette register with the binary data in said storage register, said parallel output of said palette register driving said second parallel input of said adder;

loading the six bits of said 18-bit display data in Red-Green-Blue (RGB) format corresponding to blue data through said parallel input of said barrel shifter into said shift register of said barrel shifter;

shifting said six positions in said shift register of said barrel shifter three positions to the right, filling in zeroes in the most significant digits that are vacated due to said shifting, said shift register driving said parallel output of said barrel shifter, which drive said first parallel input of said adder with the binary value in said shift register;

binarily adding the values on said first parallel input and said second parallel input of said adder, with the result driven onto said parallel output of said adder, which in turn drive said parallel input of said palette register;

storing said data on said parallel input of said palette register into said six positions of said storage register of said palette register, which drive said parallel output of said palette register with the binary data in said storage register, said parallel output of said palette register driving said second parallel input of said adder; and said gray scale output means now having the gray scale data on said five conductors.

* * * * *